United States Patent
Tanaka et al.

(10) Patent No.: US 7,098,647 B2
(45) Date of Patent: Aug. 29, 2006

(54) COAXIAL CABLE UNIT, TEST APPARATUS, AND CPU SYSTEM

(75) Inventors: Hironori Tanaka, Tokyo (JP);
Kunihiro Matsuura, Tokyo (JP);
Satoshi Kodera, Tokyo (JP); Hiroki Ando, Tokyo (JP); Yasuhiro Urabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 11 days.

(21) Appl. No.: 10/738,617

(22) Filed: Dec. 17, 2003

(65) Prior Publication Data
US 2005/0134255 A1 Jun. 23, 2005

(51) Int. Cl.
*G01R 31/02* (2006.01)
*H04B 3/26* (2006.01)

(52) U.S. Cl. .................. 324/158.1; 307/89; 333/12; 713/300

(58) Field of Classification Search .................. None
See application file for complete search history.

(56) References Cited

U.S. PATENT DOCUMENTS

| | | | | |
|---|---|---|---|---|
| 1,860,052 A | * | 5/1932 | Peterson | 343/905 |
| 5,652,558 A | * | 7/1997 | Leikus et al. | 335/4 |

FOREIGN PATENT DOCUMENTS

| | | |
|---|---|---|
| JP | 56-75032 | 11/1982 |
| JP | 62-29013 | 2/1987 |
| JP | 2-284308 | 11/1990 |
| JP | 5-59354 | 8/1993 |
| JP | 7-218598 A | 8/1995 |
| JP | 9-180550 | 7/1997 |
| JP | 2000-97994 A | 4/2000 |
| JP | 2003-31044 | 1/2003 |
| JP | 2003-130919 A | 5/2003 |

OTHER PUBLICATIONS

International Search Report dated Mar. 29, 2005 with English translation (11 pages).

* cited by examiner

Primary Examiner—Ernest Karlsen
(74) Attorney, Agent, or Firm—Osha ·Liang LLP

(57) ABSTRACT

A testing apparatus for testing a device under test, includes a power source for generating a current, a coaxial cable unit for supplying the current to the device under test, a detecting unit for detecting a voltage applied to the device under test when the current is supplied to the device under test and a judging unit for judging quality of the device under test based on the detected voltage, wherein the coaxial cable unit includes a first coaxial cable including a first internal conductor and a first external conductor, and a second coaxial cable including a second internal conductor and a second external conductor, wherein the first internal conductor and the second external conductor conduct a current from the power source towards the device under test, and the first external conductor and the second internal conductor conduct a current from the device under test towards the power source.

5 Claims, 5 Drawing Sheets

COAXIAL CABLE UNIT, TEST APPARATUS, AND CPU SYSTEM

BACKGROUND OF THE INVENTION

1. Field of the Invention

The present invention relates to coaxial cable unit, test apparatus and CPU system. More particularly, the present invention relates to a coaxial cable unit, a testing apparatus and a CPU system including the coaxial cable unit for supplying a device with an electric current generated by a power source.

2. Description of the Related Art

FIG. 1 is a block diagram showing the configuration of a testing apparatus 100 according to the conventional art relating to the present invention.

The testing apparatus 100 supplies a DUT (Device Under Test) 110 with a predetermined electric current and performs a current application voltage test to measure the voltage applied to the DUT 110. The testing apparatus 100 includes a power source 120, a coaxial cable unit 130, a detecting unit 160 and a judging unit 170.

The power source 120 generates an electric current and sends it to the coaxial cable unit 130. The coaxial cable unit 130 includes a first coaxial cable 140 and a second coaxial cable 150 and supplies the current generated by the power source 120 to the DUT 110.

The first coaxial cable 140 includes a first internal conductor 142 and a first external conductor 144 provided around the first internal conductor 142 via an insulator. The first internal and external conductors 142 and 144 conduct the current from the power source 120 towards the DUT 110. The second coaxial cable 150 includes a second internal conductor 152 and a second external conductor 154 provided around the second internal conductor 152 via an insulator. The second internal and external conductors 152 and 154 conduct the current from the DUT 110 towards the power source 120.

The detecting unit 160 detects the voltage applied to the DUT 110 when the current generated by the power source 120 is supplied to the DUT 110, and sends the detected voltage to the judging unit 170. The judging unit 170 judges the quality of the DUT 110 based on the voltage detected by the detecting unit 160.

According to the testing apparatus 100 in the conventional art relating to the present invention, through the coaxial cable unit 130, the current application voltage test can be performed with a large current supplied to the DUT 110.

FIG. 2 shows an equivalent circuit of the coaxial cable unit 130 according to the art relating to the present invention.

The first coaxial cable 140 conducts the current from S1 to S2. The equivalent circuit of the first internal conductor 142 includes a plurality of coils 146, each of which has self-inductance L1 and is coupled in series with one another. The equivalent circuit of the first external conductor 144 includes a plurality of coils 148, each of which has self-inductance L2 and is coupled in series with one another.

The second coaxial cable 150 conducts the current from G2 to G1. The equivalent circuit of the second internal conductor 152 includes a plurality of coils 156, each of which has self-inductance L1 and is coupled in series with one another. The equivalent circuit of the second external conductor 154 includes a plurality of coils 158, each of which has self-inductance L2 and is coupled in series with one another.

If the current generated by the power source 120 is changed, the current flowing through the first internal conductor 142 is changed, so the magnetic flux generated by the coils 146 is changed. Accordingly, a self-induction electromotive force is generated in the first internal conductor 142. The generated self-induction electromotive force acts to impede the flow of the current in the first internal conductor 142. In addition, if the current generated by the power source 120 is changed, the current flowing through the first external conductor 144 is changed, so the magnetic flux generated by the coils 148 is changed. Accordingly, the magnetic flux crossing the coils 146 is changed, and then a mutual induction electromotive force is generated in the first internal conductor 142. The generated mutual induction electromotive force acts to impede the flow of the current in the first internal conductor 142.

In this way, for each of the first external conductor 144, the second internal conductor 152 and the second external conductor 154, the generated self-induction and mutual induction electromotive forces act to impede the flow of the currents in the respective conductors.

Due to the induced electromotive forces acting in the testing apparatus 100 in the art relating to the present invention, the responsiveness of output current to the change in input current is decreased with regard to the coaxial cable unit 130. Particularly, by these induced electromotive forces, the testing apparatus 100 needs more time from when the current generated by the power source 120 is changed to when the current supplied to the DUT 110 is changed. Therefore, in case a sudden change in current is needed, it is difficult to perform the test highly accurately.

SUMMARY OF THE INVENTION

Therefore, it is an object of the present invention to provide a, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a coaxial cable unit for supplying a current generated by a power source to a device, includes a first coaxial cable including a first internal conductor and a first external conductor provided around the first internal conductor via an insulator and a second coaxial cable including a second internal conductor and a second external conductor provided around the second internal conductor via an insulator, wherein the first internal conductor and the second external conductor conduct a current from the power source towards the device, and the first external conductor and the second internal conductor conduct a current from the device towards the power source.

The first internal conductor and the second external conductor may be coupled in parallel with each other and conduct a current from the power source towards the device, and the first external conductor and the second internal conductor may be coupled in parallel with each other and conduct a current from the device towards the power source.

According to the second aspect of the present invention, a testing apparatus for testing a device under test, includes a power source for generating a current, a coaxial cable unit for supplying the current generated by the power source to the device under test, a detecting unit for detecting a voltage applied to the device under test when the current is supplied to the device under test and a judging unit for judging quality of the device under test based on the voltage detected by the detecting unit, wherein the coaxial cable unit includes a first coaxial cable including a first internal conductor and a first external conductor provided around the first internal conductor via an insulator and a second coaxial cable including a second internal conductor and a second external conductor provided around the second internal conductor via an insulator, wherein the first internal conductor and the second external conductor conduct a current from the power source towards the device under test, and the first external conductor and the second internal conductor conduct a current from the device under test towards the power source.

According to the third aspect of the present invention, a testing apparatus for testing a device under test, includes a power source for generating a current, a coaxial cable unit for supplying the current generated by the power source to the device under test, a detecting unit for detecting a current supplied to the device under test when a voltage is applied to the device under test and a judging unit for judging quality of the device under test based on the voltage detected by the detecting unit, wherein the coaxial cable unit includes a first coaxial cable including a first internal conductor and a first external conductor provided around the first internal conductor via an insulator and a second coaxial cable including a second internal conductor and a second external conductor provided around the second internal conductor via an insulator, wherein the first internal conductor and the second external conductor conduct a current from the power source towards the device under test, and the first external conductor and the second internal conductor conduct a current from the device under test towards the power source.

According to the fourth aspect of the present invention, a CPU system driven by a current generated by a power source, includes a CPU for performing a calculation process based on a program and a coaxial cable unit for supplying the current generated by the power source to the CPU, wherein the coaxial cable unit includes a first coaxial cable including a first internal conductor and a first external conductor provided around the first internal conductor via an insulator and a second coaxial cable including a second internal conductor and a second external conductor provided around the second internal conductor via an insulator, wherein the first internal conductor and the second external conductor conduct a current from the power source towards the CPU, and the first external conductor and the second internal conductor conduct a current from the CPU towards the power source.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
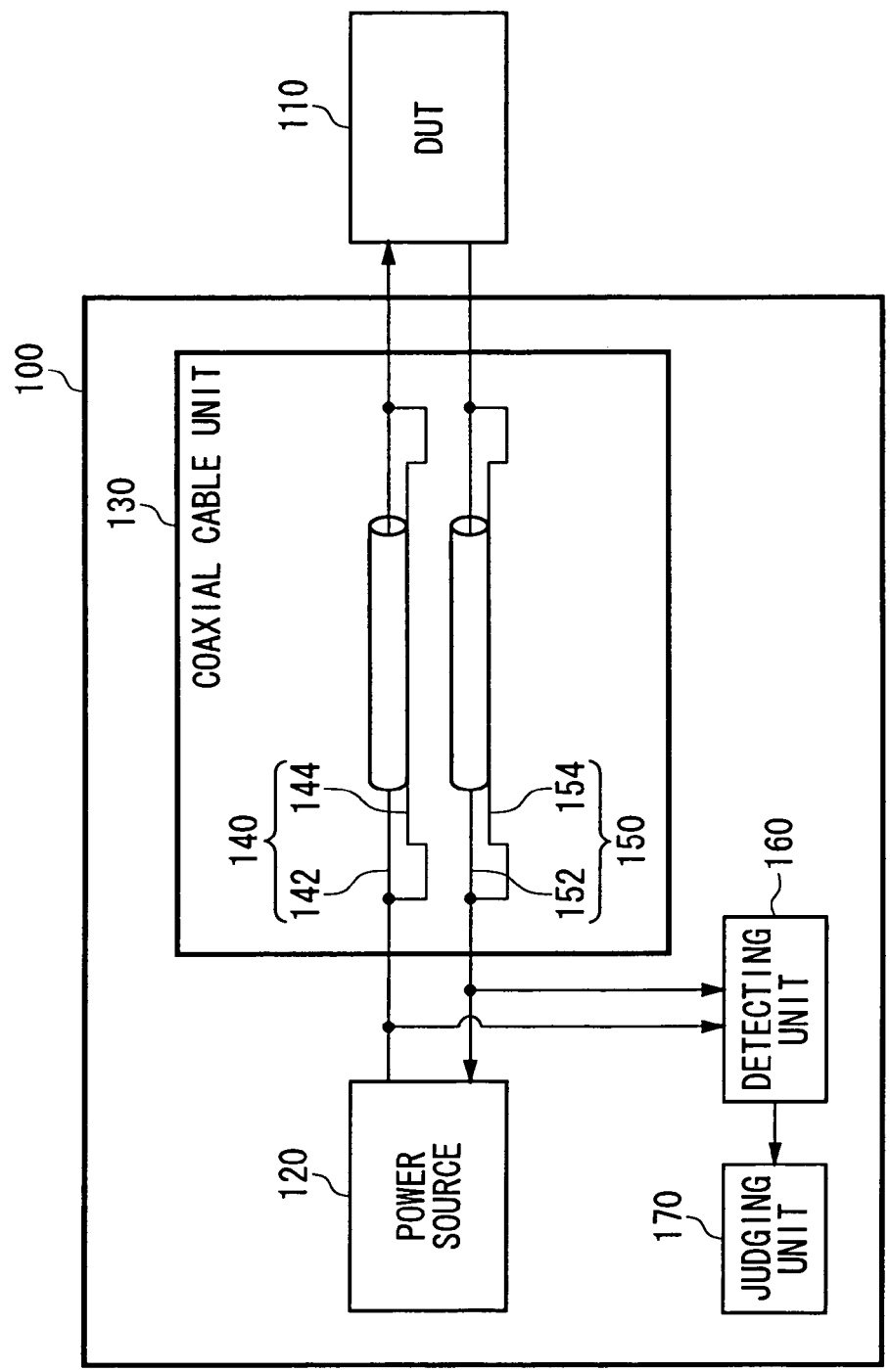
FIG. 1 is a block diagram showing the configuration of a testing apparatus 100 in the art relating to the present invention.
Figure 2:
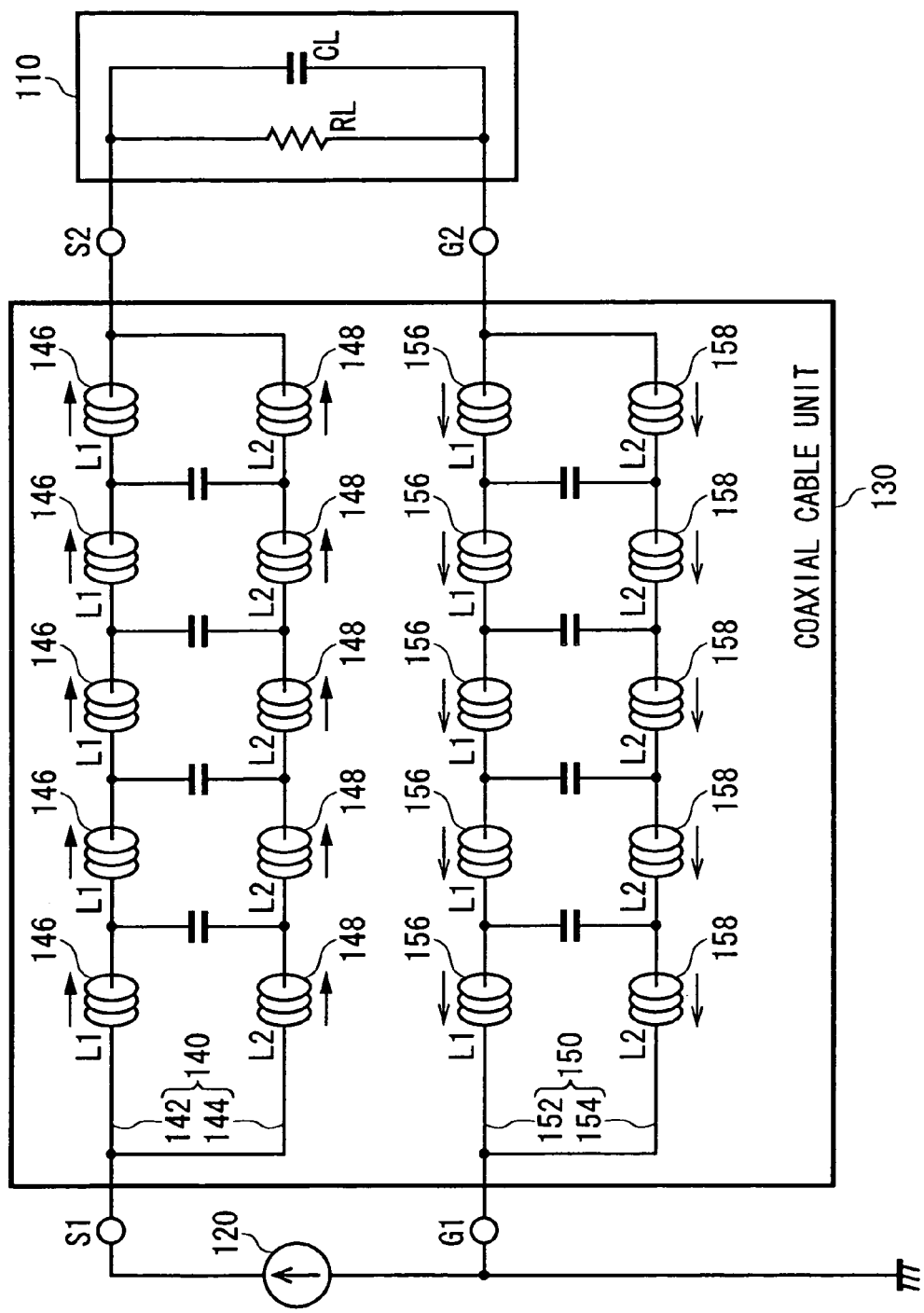
FIG. 2 shows the equivalent circuit of a coaxial cable unit 130 in the art relating to the present invention.
Figure 3:
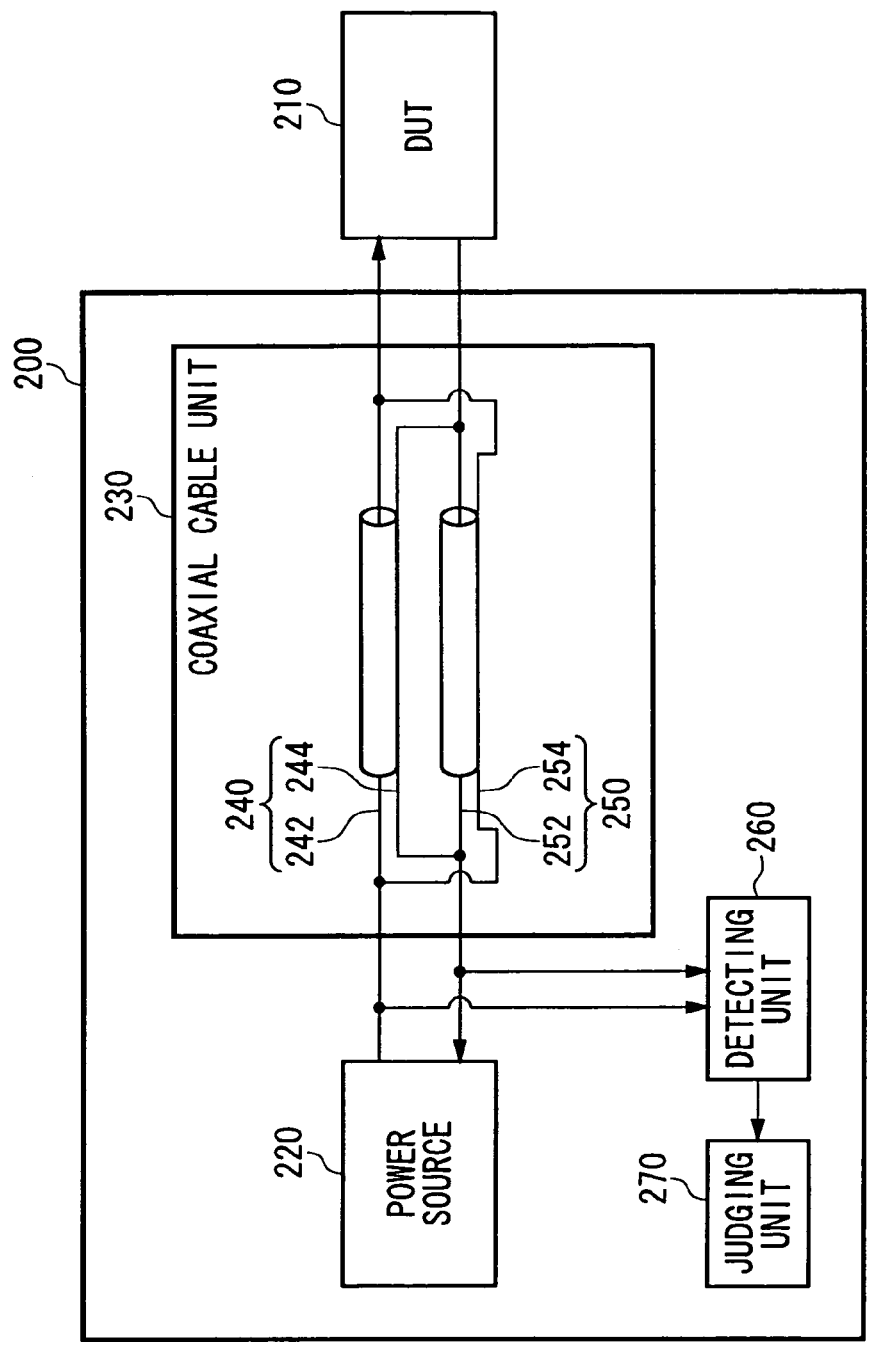
FIG. 3 is a block diagram showing an example of the configuration of a testing apparatus 200 according to a first embodiment of the present invention.

FIG. 3 is a block diagram showing an example of the configuration of a testing apparatus 200 according to a first embodiment of the present invention. The testing apparatus 200 performs a current application voltage test to measure the voltage applied to the DUT 210 supplied with a predetermined current and a voltage application current test to measure the current supplied to the DUT 210 applied with a predetermined voltage, and hereinafter it will be described about performing the current application voltage test for example. The testing apparatus 200 includes a power source 220, a coaxial cable unit 230, a detecting unit 260, and a judging unit 270.

The testing apparatus 200 according to the first embodiment of the present invention supplies the DUT 210 with a large current needed to perform the test using the coaxial cable unit 230 as a transmission line of current. Here, the testing apparatus 200 makes internal and external conductors conduct currents in the directions different from each other in a coaxial cable included in the coaxial cable unit 230, so that the self-induction electromotive force and the mutual induction electromotive force generated when the currents are changed can be offset by each other. Accordingly, it is an object to perform the test highly accurately even though a sudden change in current is needed, through improving the responsiveness of output current to the change in input current in the coaxial cable unit 230.

The power source 220 generates a current and sends it to the coaxial cable unit 230. The coaxial cable unit 230 includes a first coaxial cable 240 and a second coaxial cable 250 and supplies the current generated by the power source 220 to the DUT 210. Here, the first and second coaxial cables 240 and 250 may not be necessarily as close to each other as they are tied up, so they may be separated from each other.

The first coaxial cable 240 includes a first internal conductor 242 and a first external conductor 244 provided around the first internal conductor 242 via an insulator. The second coaxial cable 250 includes a second internal conductor 252 and a second external conductor 254 provided around the second internal conductor 252 via an insulator. The first internal conductor 242 and the second external conductor 254 are coupled in parallel with each other, and conduct the current from the power source 220 towards the DUT 210. The first external conductor 244 and the second internal conductor 252 are coupled in parallel with each other, and conduct the current from the DUT 210 towards the power source 220.

The detecting unit 260 detects the voltage applied to the DUT 210 when the current generated by the power source 220 is supplied to the DUT 210, and sends the detected voltage to the judging unit 270. The judging unit 270 judges the quality of the DUT 210 based on the voltage detected by the detecting unit 260. For example, the judging unit 270 judges the quality of the DUT 210 by converting the voltage detected by the detecting unit 260 into digital data using an analog/digital converter and comparing the digital data with a predetermined and expected value. Although the detecting unit 260 detects the voltage applied to the DUT 210 when the current generated by the power source 220 is supplied to the DUT 210 in the present example, it may detect the current applied to the DUT when the voltage generated by the power source 220 is applied to the DUT 210 in the voltage application current test. In this case, the judging unit 270 judges the quality of the DUT 210 based on the current detected by the detecting unit 260.

According to the testing apparatus 200 in the first embodiment of the present invention, since the first internal conductor 242 and the second external conductor 254 are coupled in parallel with each other and the first external conductor 244 and the second internal conductor 252 are coupled in parallel with each other, a large current generated by the power source 220 can be supplied to the DUT 210 to perform the current application voltage test and the voltage application current test.

Figure 4:
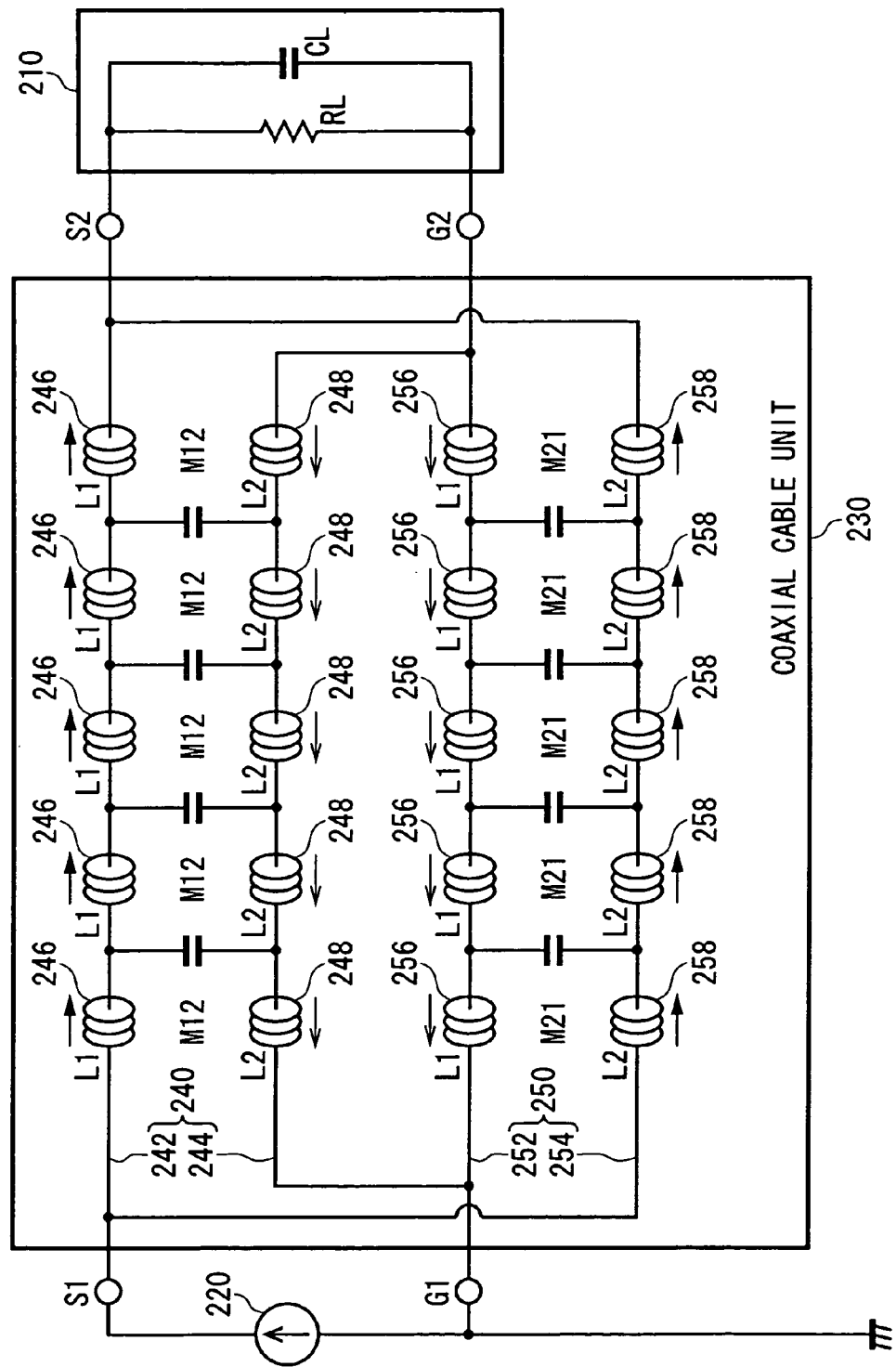
FIG. 4 shows an example of the equivalent circuit of a coaxial cable unit 230 according to a first embodiment of the present invention.

FIG. 4 shows an example of the equivalent circuit of the coaxial cable unit 230 according to the first embodiment of the present invention.

The equivalent circuit of the first internal conductor 242 includes a plurality of coils 246, each of which has self-inductance L1 and is coupled in series with one another. The equivalent circuit of the first external conductor 244 includes a plurality of coils 248, each of which has self-inductance L2 and is coupled in series with one another. The equivalent circuit of the second internal conductor 252 includes a plurality of coils 256, each of which has self-inductance L1 and is coupled in series with one another. The equivalent circuit of the second external conductor 254 includes a plurality of coils 258, each of which has self-inductance L2 and is coupled in series with one another. The first internal conductor 242 and the second external conductor 254 conduct the current from S1 towards S2. The first external conductor 244 and the second internal conductor 252 conduct the current from G2 towards G1.

In case the current generated by the power source is changed, the current flowing through the first internal conductor 242 is changed, so that the magnetic flux generated by the coils 246 is changed. Accordingly, a self-induction electromotive force is generated in the first internal conductor 242. The generated self-induction electromotive force causes the current to flow from S2 towards S1, i.e. opposite the direction of the current in the first internal conductor 242. In addition, when the current generated by the power source 220 is changed, the current flowing through the first external conductor 244 is changed, so that the magnetic flux generated by the coils 248 is changed. Accordingly, the magnetic flux crossing the coils 246 is changed, and a mutual induction electromotive force is generated in the first internal conductor 242. The generated mutual induction electromotive force causes the current to flow from S1 towards S2, i.e. along the direction of the current in the first internal conductor 242. Therefore, the mutual induction electromotive force generated by the first internal conductor 242 acts to be offset by the self-induction electromotive force generated by the first internal conductor 242. In other words, the self-inductance in the first internal conductor 242 is substantially decreased. Accordingly, the responsiveness of output current to the change in input current is improved with regard to the first internal conductor 242.

On the other hand, in case the current generated by the power source 220 is changed, the current flowing through the first external conductor 244 is changed, so that the magnetic flux generated by the coils 248 is changed. Accordingly, the self-induction electromotive force is generated in the first external conductor 244. The generated self-induction electromotive force causes the current to flow from G1 towards G2, i.e. opposite the direction of the current in the first external conductor 244. In addition, when the current generated by the power source 220 is changed, the current flowing through the first internal conductor 242 is changed, so that the magnetic flux generated by the coils 246 is changed. Accordingly, the magnetic flux crossing the coils 248 is changed, and the mutual induction electromotive force is generated in the first external conductor 244. The generated mutual induction electromotive force causes the current to flow from G2 towards G1, i.e. along the direction of the current in the first external conductor 244. Therefore, the mutual induction electromotive force generated by the first external conductor 244 acts to be offset by the self-induction electromotive force generated by the first external conductor 244. In other words, the self-inductance with regard to the first external conductor 244 is substantially decreased. Accordingly, the responsiveness of output current to the change in input current is improved with regard to the first external conductor 244.

In the same way, for each of the second internal conductor 252 and the second external conductor 254, the responsiveness of output current to the change in input current is improved. As above, the responsiveness of output current to the change in input current is improved with regard to the coaxial cable unit 230.

Here, the mutual inductance M12 to the first external conductor 244 when the current flowing through the first internal conductor 242 is changed is different from the mutual inductance M21 to the first internal conductor 242 when the current flowing through the first external conductor 244 is changed. In addition, so is the mutual inductance to the second coaxial cable 250.

Therefore, the current flowing from S1 towards S2 obtains the gain caused by the mutual inductance M21 in first internal conductor 242 and the gain caused by the mutual inductance M12 in the second external conductor 254. In addition, the current flowing from G2 towards G1 obtains the gain caused by the mutual inductance M12 in the first external conductor 244 and the gain caused by the mutual inductance M21 in the second internal conductor 252. In other words, the current flowing from S1 towards S2 and the current flowing from G2 towards G1 are equal to each other in gains caused by mutual induction, so they can flow through the circuit with high efficiency.

Further, the configuration shown in the drawings is just an example, and thus it may be modified in a variety of ways. For example, the first and second internal conductors 242 and 252 may be coupled in parallel with each other so that the current can flow from the power source 220 towards the DUT 210, or the first and second external conductors 244 and 254 may be coupled in parallel with each other so that the current can flow from the DUT 210 towards the power source 220.

In addition, for example, the first and second external conductors 244 and 254 may be coupled in parallel with each other so that the current can flow from the power source 220 towards the DUT 210, or the first and second internal conductors 242 and 252 may be coupled in parallel with each other so that the current can flow from the DUT 210 towards the power source 220.

According to the testing apparatus 200 in the first embodiment of the present invention, since the responsiveness of output current to the change in input current is improved with regard to the coaxial cable unit 230, the test can be performed highly accurately even though a sudden change in current is needed such as a current of 100A with the rising time of 2 μs.

Figure 5:
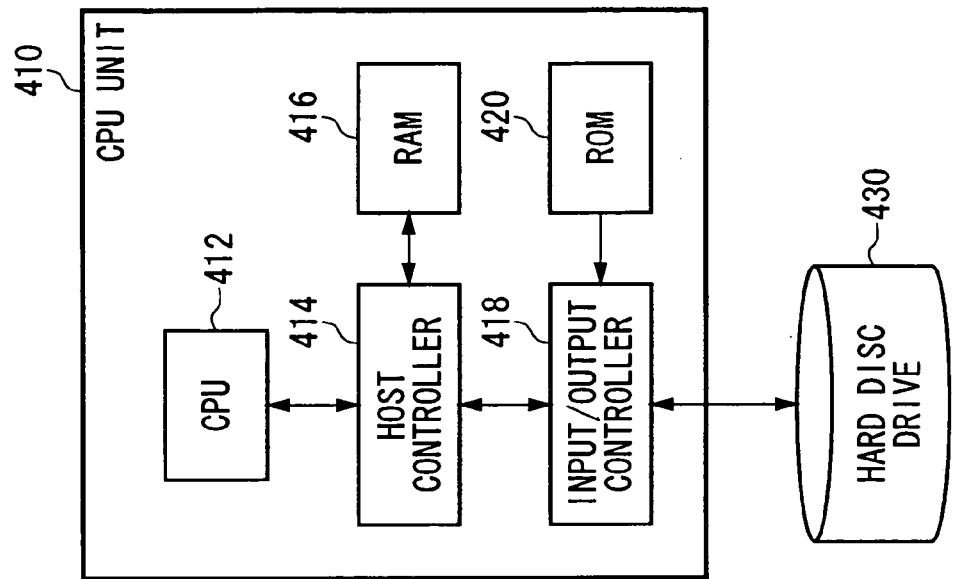
FIG. 5 shows an example of the configuration of a computer system 400 according to a second embodiment of the present invention.
Figure 5:
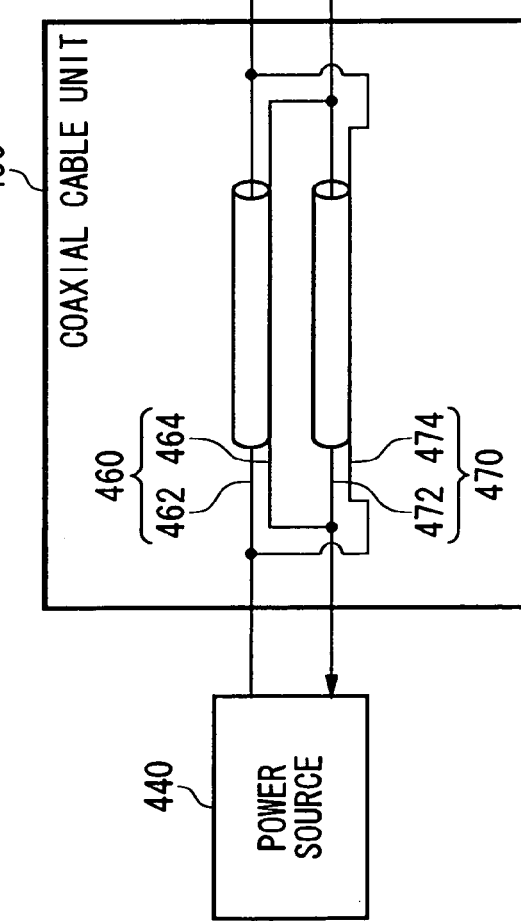

FIG. 5 shows an example of the configuration of a computer system 400 according to a second embodiment of the present invention. The computer system 400 includes a CPU unit 410, a hard disc drive 430, a power source 440, and a coaxial cable unit 450. The computer system 400 is, e.g. a personal computer based on the standard of OADG (Open Architecture Developers' Group in Japan).

The CPU unit 410 includes a CPU 412, a host controller 414, a RAM 416, an input/output controller 418, and a ROM 420. The CPU unit 410 is, e.g. a motherboard in a personal computer. The host controller 414 couples the CPU 412 and the RAM 416 to each other. The input/output controller 418 couples the host controller 414, the ROM 420 and the hard disc drive 430. The CPU 412 performs a calculation process based on a program stored in the RAM 416 and the ROM 420. The hard disc drive 430 stores a program and data being used by the computer system 400.

The power source 440 generates a current, and sends it to a coaxial cable unit 450. The coaxial cable unit 450 includes a first coaxial cable 460 and a second coaxial cable 470, and supplies the current generated by the power source 440 to the CPU 412 via a wiring formed in the CPU unit 410. The CPU 412 and the coaxial cable unit 450 are an example of the CPU system according to the present invention.

The first coaxial cable 460 includes a first internal conductor 462 and a first external conductor 464 provided around the first internal conductor 462 via an insulator. The second coaxial cable 470 includes a second internal conductor 472 and a second external conductor 474 provided around the second internal conductor 472 via an insulator. The first internal conductor 462 and the second external conductor 474 are coupled in parallel with each other, and conduct the current from the power source 440 towards the CPU 412. The first external conductor 464 and the second internal conductor 472 are coupled in parallel with each other, and conduct the current from the CPU 412 towards the power source 440.

Accordingly, in the same way as the coaxial cable unit 230 in the first embodiment of the present embodiment shown in FIG. 4, for each of the first internal conductor 462, the first external conductor 464, the second internal conductor 472 and the second external conductor 474, the responsiveness of output current to the change in input current is improved, so that the responsiveness of output current to the change in input current is improved with regard to the coaxial cable unit 450.

According to the computer system 400 in the second embodiment of the present invention, since the responsiveness of output current to the change in input current is improved with regard to the coaxial cable unit 450, the current needed by the CPU 412 can be supplied accurately even if the change in current supplied to the CPU 412 is large.

As is obvious from the description above, according to the present invention, the responsiveness of output current to the change in input current can be improved with regard to the coaxial cable unit.

Although the present invention has been described by way of exemplary embodiments, it should be understood that those skilled in the art might make many changes and substitutions without departing from the spirit and the scope of the present invention which is defined only by the appended claims.

What is claimed is:

1. A coaxial cable unit for supplying a current generated by a power source to a device, comprising:
    a first coaxial cable comprising a first internal conductor and a first external conductor provided around said first internal conductor via an insulator; and
    a second coaxial cable comprising a second internal conductor and a second external conductor provided around said second internal conductor via an insulator,
    wherein said first internal conductor and said second external conductor conduct a current from said power source towards said device, and said first external conductor and said second internal conductor conduct a current from said device towards said power source.

2. A coaxial cable unit as claimed in claim 1, wherein said first internal conductor and said second external conductor are coupled in parallel with each other and conduct a current from said power source towards said device, and
    said first external conductor and said second internal conductor are coupled in parallel with each other and conduct a current from said device towards said power source.

3. A testing apparatus for testing a device under test, comprising:
    a power source for generating a current;
    a coaxial cable unit for supplying said current generated by said power source to said device under test;
    a detecting unit for detecting a voltage applied to said device under test when said current is supplied to said device under test; and
    a judging unit for judging quality of said device under test based on said voltage detected by said detecting unit,
    wherein said coaxial cable unit comprises:
        a first coaxial cable comprising a first internal conductor and a first external conductor provided around said first internal conductor via an insulator; and
        a second coaxial cable comprising a second internal conductor and a second external conductor provided around said second internal conductor via an insulator,
        wherein said first internal conductor and said second external conductor conduct a current from said power source towards said device under test, and said first external conductor and said second internal conductor conduct a current from said device under test towards said power source.

4. A testing apparatus for testing a device under test, comprising:
    a power source for generating a current;
    a coaxial cable unit for supplying said current generated by said power source to said device under test;
    a detecting unit for detecting a current supplied to said device under test when a voltage is applied to said device under test; and
    a judging unit for judging quality of said device under test based on said voltage detected by said detecting unit,
    wherein said coaxial cable unit comprises:
        a first coaxial cable comprising a first internal conductor and a first external conductor provided around said first internal conductor via an insulator; and
        a second coaxial cable comprising a second internal conductor and a second external conductor provided around said second internal conductor via an insulator, wherein said first internal conductor and said second external conductor conduct a current from said power source towards said device under test, and said first external conductor and said second internal conductor conduct a current from said device under test towards said power source.

5. A CPU system driven by a current generated by a power source, comprising:
- a CPU for performing a calculation process based on a program; and
- a coaxial cable unit for supplying said current generated by said power source to said CPU, wherein said coaxial cable unit comprises:
- a first coaxial cable comprising a first internal conductor and a first external conductor provided around said first internal conductor via an insulator; and
- a second coaxial cable comprising a second internal conductor and a second external conductor provided around said second internal conductor via an insulator, wherein said first internal conductor and said second external conductor conduct a current from said power source towards said CPU, and said first external conductor and said second internal conductor conduct a current from said CPU towards said power source.

\* \* \* \* \*